United States Patent
Chen et al.

(10) Patent No.: US 12,557,516 B2
(45) Date of Patent: Feb. 17, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Li Chen, Beijing (CN); Jaeho Lee, Beijing (CN); Dongyu Gao, Beijing (CN); Cheng Zeng, Beijing (CN); Zhenye Wei, Beijing (CN); Zhen Sun, Beijing (CN); Shangshu Sun, Beijing (CN); Qiyun Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 549 days.

(21) Appl. No.: 18/041,069

(22) PCT Filed: Mar. 16, 2022

(86) PCT No.: PCT/CN2022/081096
§ 371 (c)(1),
(2) Date: Feb. 8, 2023

(87) PCT Pub. No.: WO2023/173306
PCT Pub. Date: Sep. 21, 2023

(65) Prior Publication Data
US 2024/0268176 A1 Aug. 8, 2024

(51) Int. Cl.
*H10K 59/38* (2023.01)
*H10K 59/122* (2023.01)
(Continued)

(52) U.S. Cl.
CPC ........... *H10K 59/38* (2023.02); *H10K 59/122* (2023.02); *H10K 59/873* (2023.02);
(Continued)

(58) Field of Classification Search
CPC .... H10K 59/38; H10K 59/122; H10K 59/877; H10K 59/873; H10K 59/878; H10K 2102/331
(Continued)

(56) References Cited

U.S. PATENT DOCUMENTS

2015/0333102 A1* 11/2015 Sato ................... H10H 20/8514
257/13
2017/0148957 A1 5/2017 Choi
(Continued)

FOREIGN PATENT DOCUMENTS

| CN | 1967328 A | 5/2007 |
| CN | 110911456 A | 3/2020 |

(Continued)

OTHER PUBLICATIONS

International Search Report & Written Opinion mailed Nov. 28, 2022, regarding PCT/CN2022/081096.

*Primary Examiner* — James R Greece
*Assistant Examiner* — Hana S Featherly
(74) *Attorney, Agent, or Firm* — Intellectual Valley Law, P.C.

(57) ABSTRACT

A display substrate includes a first base substrate; a reflective layer on the first base substrate; a color conversion layer on a side of the reflective layer away from the first base substrate; and a plurality of light sources in an inter-subpixel region and a color filter comprising a plurality of color filter blocks at least partially in a plurality of subpixel regions, respectively, on a side of the color conversion layer away from the reflective layer. One or more light sources of the
(Continued)

plurality of light sources are in a first gap between two adjacent color filter blocks of the plurality of color filter blocks. An orthographic projection of the plurality of light sources and an orthographic projection of the color conversion layer on a plane perpendicular to a surface of the first base substrate and intersecting the plurality of light sources and the color conversion layer are non-overlapping.

20 Claims, 12 Drawing Sheets

(51) Int. Cl.
    *H10K 59/80*     (2023.01)
    *H10K 102/00*     (2023.01)
(52) U.S. Cl.
    CPC ......... *H10K 59/877* (2023.02); *H10K 59/878* (2023.02); *H10K 2102/331* (2023.02)
(58) Field of Classification Search
    USPC .......................................................... 313/498
    See application file for complete search history.

(56) References Cited

U.S. PATENT DOCUMENTS

| | | | |
|---|---|---|---|
| 2019/0067379 A1* | 2/2019 | Uchida | ................ H10K 59/878 |
| 2019/0198819 A1* | 6/2019 | Shin | ........................ H10K 59/38 |
| 2020/0135811 A1 | 4/2020 | Jung et al. | |
| 2020/0217998 A1 | 7/2020 | Jung et al. | |
| 2021/0408130 A1 | 12/2021 | Pan | |
| 2022/0271095 A1 | 8/2022 | Jin et al. | |

FOREIGN PATENT DOCUMENTS

| | | |
|---|---|---|
| CN | 111105721 A | 5/2020 |
| CN | 112133718 A | 12/2020 |
| CN | 112631020 A | 4/2021 |
| JP | 2007115626 A | 5/2007 |
| JP | 2008066103 A | 3/2008 |
| JP | 2014187077 A | 10/2014 |
| JP | 2015128027 A | 7/2015 |
| KR | 20210124556 A | 10/2021 |
| WO | 2015174464 A1 | 11/2015 |

\* cited by examiner

DISPLAY SUBSTRATE AND DISPLAY APPARATUS

CROSS-REFERENCE TO RELATED APPLICATION

This application is a national stage application under 35 U.S.C. § 371 of International Application No. PCT/CN2022/081096, filed Mar. 16, 2022, the contents of which are incorporated by reference in the entirety.

TECHNICAL FIELD

The present invention relates to display technology, more particularly, to a display substrate and a display apparatus.

BACKGROUND

Quantum dots material has excellent optical and electrical properties, including a narrow emission peak (with a half-peak width of approximately 30 nm), a tunable spectrum (ranging from visible light to infrared light), high photochemical stability, and a low starting voltage. Wavelengths of light emitted from quantum dots materials are tunable at least in part based on the particle sizes of the quantum dots. Due to these excellent properties, quantum dots have become a focus of research and development in the fields of display technology.

SUMMARY

In one aspect, the present disclosure provides a display substrate, comprising a first base substrate; a reflective layer on the first base substrate; a color conversion layer on a side of the reflective layer away from the first base substrate; and a plurality of light sources in an inter-subpixel region and a color filter comprising a plurality of color filter blocks at least partially in a plurality of subpixel regions, respectively, on a side of the color conversion layer away from the reflective layer; wherein one or more light sources of the plurality of light sources are in a first gap between two adjacent color filter blocks of the plurality of color filter blocks; and an orthographic projection of the plurality of light sources and an orthographic projection of the color conversion layer on a plane perpendicular to a surface of the first base substrate and intersecting the plurality of light sources and the color conversion layer are non-overlapping.

Optionally, an individual color filter block of the plurality of color filter blocks is in a second gap between two light sources of the plurality of light sources; and any pair of two light sources are spaced apart by a color filter block.

Optionally, the display substrate further comprises a light scattering layer on the reflective layer, the light scattering layer comprising a plurality of light scattering blocks; and an orthographic projection of a respective light scattering block of the plurality of light scattering blocks on the first base substrate at least partially overlaps with an orthographic projection of an individual color filter block of the plurality of color filter blocks on the first base substrate.

Optionally, the display substrate further comprises a definition layer defining a plurality of apertures configured to receive a plurality of color conversion blocks of the color conversion layer.

Optionally, the definition layer comprises a plurality of ridges arranged in rows and columns; wherein, in a cross-section of a respective ridge of the plurality of ridges along a plane intersecting the plurality of color conversion blocks, a width of the respective ridge gradually decreases along a direction away from the first base substrate; an included angle between a lateral surface of a respective ridge and a surface of the first base substrate is between 0 degree and 90 degrees; and a portion of the reflective layer is on lateral side surfaces of the plurality of ridges.

Optionally, the display substrate further comprises a first encapsulating layer on a side of the color conversion layer away from the reflective layer, encapsulating the color conversion layer; wherein the plurality of light sources and the plurality of color filter blocks are on a side of the first encapsulating layer away from the color conversion layer.

Optionally, the display substrate further comprises a third encapsulating layer on a side of the color conversion layer away from the first encapsulating layer, encapsulating the color conversion layer.

Optionally, a first respective light source and a second respective light source of the plurality of light sources are configured to provide incident light to a respective color conversion block of the color conversion layer; an included angle between a first direction and a second direction is in a range of 60 degrees to 80 degrees; the first direction is a direction along a thickness direction of the first encapsulating layer; and the second direction is a direction from a center of the first respective light source to a center of the respective color conversion block.

Optionally, subpixel regions respectively of different colors have different areas; and light sources configured to provide incident light to the subpixel regions respectively of different colors have different areas.

Optionally, in a column of color filter blocks of a same color, a respective light source is between two adjacent color filter blocks of the same color.

Optionally, in a row of color filter blocks, two independently-controlled light sources are between two adjacent color filter blocks of different colors.

Optionally, the definition layer is on a side of the reflective layer away from the color conversion layer; and the reflective layer comprises a plurality of portions respectively received in the plurality of apertures defined by the definition layer.

Optionally, along a plane intersecting two adjacent color conversion blocks of the plurality of color conversion blocks and parallel to a thickness direction of the color conversion layer, a cross-section of a portion of the reflective layer received in a respective aperture defined by the definition layer has a trapezoidal shape.

Optionally, along a plane intersecting two adjacent color conversion blocks of the plurality of color conversion blocks and parallel to a thickness direction of the color conversion layer, a cross-section of a portion of the reflective layer received in a respective aperture defined by the definition layer has a partial circular shape.

Optionally, the definition layer and the color conversion layer are on the reflective layer.

Optionally, the reflective layer is a substantially planar layer extending substantially throughout a display area of the display substrate.

Optionally, a respective light source of the plurality of light sources comprises a buffer layer; an electrode on the buffer layer and configured to provide data signal to the respective light source; a passivation layer on a side of the electrode away from the buffer layer; an anode on a side of the passivation layer away from the electrode, the anode extending through the passivation layer to connect to the electrode; a light emitting layer on a side of the anode away from the passivation layer; a cathode on a side of the light emitting layer away from the anode; and a second encapsulating layer on a side of the cathode away from the light emitting layer, encapsulating the respective light source.

Optionally, the respective light source further comprises a driving circuit configured to drive light emission in the light emitting layer; a driving transistor of the driving circuit is in the inter-subpixel region; and an orthographic projection of the light emitting layer on a second base substrate is non-overlapping with an orthographic projection of the driving transistor on the second base substrate.

Optionally, an orthographic projection of the respective color conversion block on the first base substrate at least partially overlaps with an orthographic projection of an individual light source of the plurality of light sources on the first base substrate.

In another aspect, the present disclosure provides a display apparatus, comprising the display substrate described herein or fabricated by a method described herein, and an integrated circuit connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate and a display apparatus that substantially obviate one or more of the problems due to limitations and disadvantages of the related art. In one aspect, the present disclosure provides a display substrate. In some embodiments, the display substrate includes a first base substrate; a reflective layer on the first base substrate; a color conversion layer on a side of the reflective layer away from the first base substrate; and a plurality of light sources in an inter-subpixel region and a color filter comprising a plurality of color filter blocks at least partially in a plurality of subpixel regions, respectively, on a side of the color conversion layer away from the reflective layer. Optionally, one or more light sources of the plurality of light sources are in a first gap between two adjacent color filter blocks of the plurality of color filter blocks. Optionally, an orthographic projection of the plurality of light sources and an orthographic projection of the color conversion layer on a plane perpendicular to a surface of the first base substrate and intersecting the plurality of light sources and the color conversion layer are non-overlapping.

In quantum dots display panels, a light source (e.g., a blue light source) is used to excite quantum dots to emit light based on the photoluminescence excitation principle. Related quantum dots display panels typically adopt a top-emission structure, in which light emission luminance level varies depending on a view angle, due to microcavity effect. In contrast, quantum dots display panels having a bottom-emission structure are substantially free of the microcavity effect, because the light source in the bottom-emission type quantum dots display panels has a light transmissive anode and a highly reflective cathode. The inventors of the present disclosure discover that wide-angle interference enhancement and multi-beam interference enhancement in the bottom-emission type quantum dots display panels can in fact enhance the light emission luminance level over a wide view angle range, including certain relatively large view angles. Based on these characteristics, the inventors of the present disclosure discover a novel quantum dots display panel having a unique structure that further enhance light conversion efficiency significantly.

Figure 1:
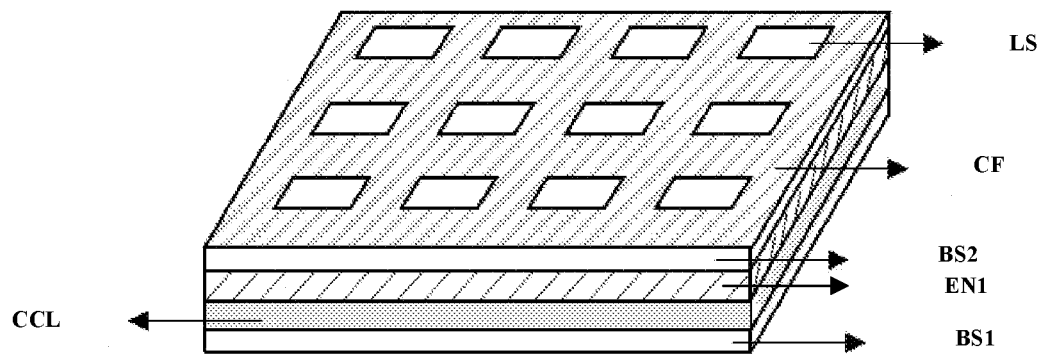
FIG. 1 is a schematic diagram illustrating the structure of a display substrate in some embodiments according to the present disclosure.

FIG. 1 is a schematic diagram illustrating the structure of a display substrate in some embodiments according to the present disclosure. Referring to FIG. 1, the display substrate in some embodiments includes a first base substrate BS1, a color conversion layer CCL on the first base substrate BS1, a first encapsulating layer EN1 on a side of the color conversion layer CCL away from the first base substrate BS1, a second base substrate BS2 on a side of the first encapsulating layer EN1 away from the color conversion layer CCL, and a color filter CF and a plurality of light sources LS on a side of the second base substrate BS2 away from the first encapsulating layer EN1. In some embodiments, the color filter CF and the plurality of light sources LS are disposed on a same surface, e.g., a surface of the second base substrate BS2, achieving an ultra-thin display substrate.

Various appropriate materials may be used for making the first base substrate BS1, including a rigid material such as glass or a flexible material such as a flexible polymer material. In one example, a flexible material layer may be formed on a rigid substrate, various layers of the display substrate are then formed on the flexible material layer. The flexible material layer may then be stripped off from the rigid substrate, e.g., using a laser stripping process.

Figure 2A:
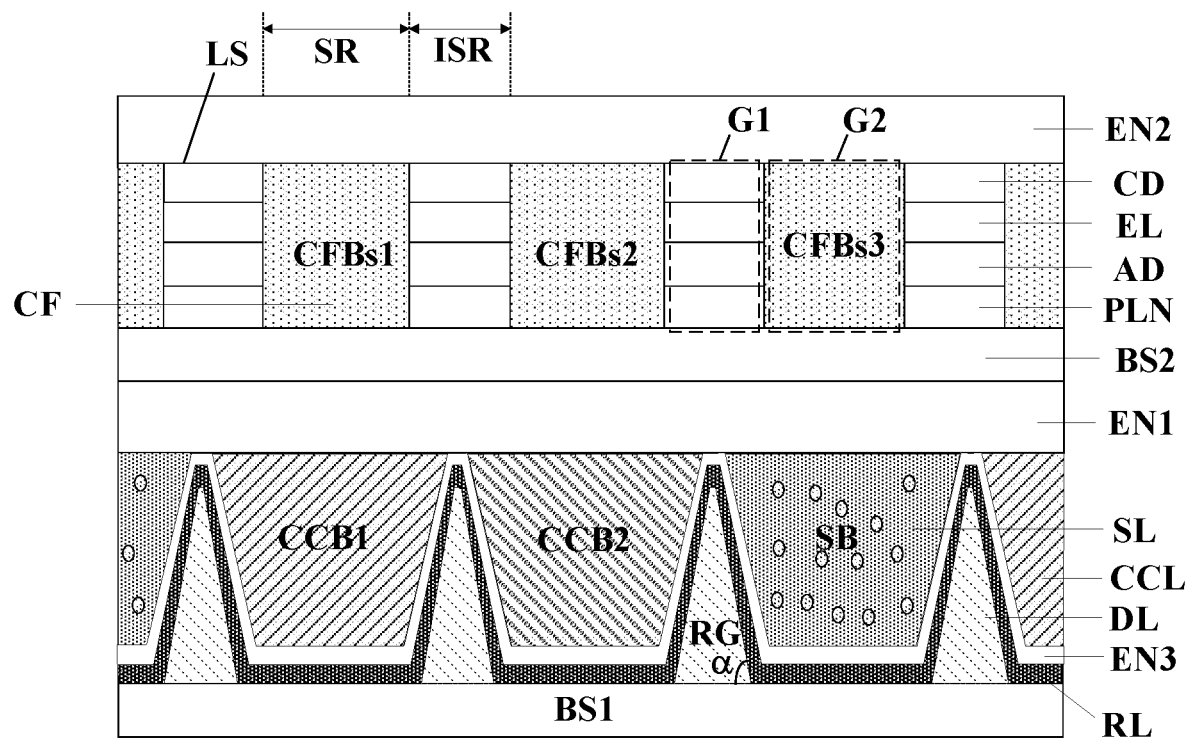
FIG. 2A is a cross-sectional view of a display substrate in some embodiments according to the present disclosure.

FIG. 2A is a cross-sectional view of a display substrate in some embodiments according to the present disclosure. Referring to FIG. 2A, the display substrate in some embodiments includes a first base substrate BS1, a definition layer DL on the first base substrate BS1 defining a plurality of apertures; a reflective layer RL on a side of the definition layer DL away from the first base substrate BS1, configured to reflect light toward a direction away from the first base substrate BS1, a color conversion layer CCL on a side of the reflective layer RL away from the base substrate BS, configured to convert the incident light into a light of a different color. Optionally, the color conversion layer CCL includes a plurality of color conversion blocks. For example, the plurality of color conversion blocks include a first color conversion block CCB1 and a second color conversion block CCB2. In one example, the first color conversion block CCB1 is configured to convert a light of a third color (e.g., a blue light) into a light of a first color (e.g., a red light). In another example, the second color conversion block CCB2 is configured to convert the light of the third color (e.g., a blue light) into a light of a second color (e.g., a green light). Subsequent to converting the light of the third color into the light of the first color by the first color conversion block CCB1, and/or converting the light of the third color into the light of the second color by the second color conversion block CCB2, the reflective layer RL is configured to reflect the light of the first color and/or the light of the second color toward a direction away from the first base substrate BS1.

In some embodiments, the display substrate further includes a light scattering layer SL on a side of the reflective layer RL away from the first base substrate BS1, configured to scatter an incident light. Optionally, the light scattering layer SL does not convert a color of the incident light. Optionally, the light scattering layer SL includes a plurality of light scattering blocks, for example, a light scattering block SB as shown in FIG. 2A. Subsequent to scattering the incident light, the reflective layer RL is configured to reflect the incident light toward a direction away from the first base substrate BS1.

Figure 3:
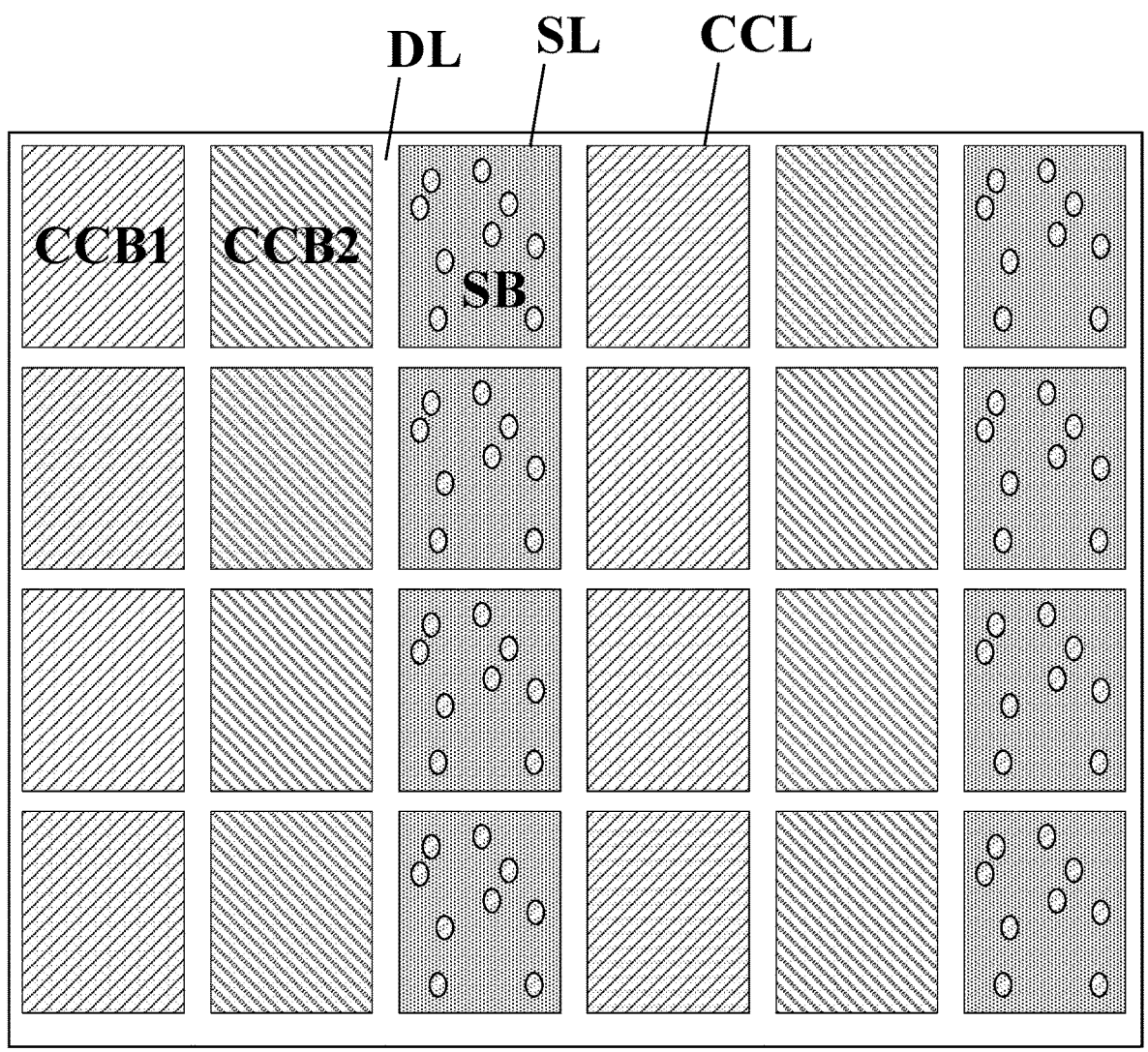
FIG. 3 is a plan view of a color conversion layer, a light scattering layer, and a definition layer in a display substrate in some embodiments according to the present disclosure.

In some embodiments, the plurality of color conversion blocks and the plurality of light scattering blocks are received in a plurality of apertures defined by the definition layer DL. Optionally, at least a portion of the reflective layer RL are received in the plurality of apertures. FIG. 3 is a plan view of a color conversion layer, a light scattering layer, and a definition layer in a display substrate in some embodiments according to the present disclosure. Referring to FIG. 3, in some embodiments, the definition layer DL spaces apart blocks of the color conversion layer CCL and the light scattering layer SL from each other.

Referring to FIG. 2A, in some embodiments, the display substrate further includes a first encapsulating layer EN1 on a side of the color conversion layer CCL and the light scattering layer SL away from the first base substrate BS1, encapsulating the color conversion layer CCL and the light scattering layer SL.

In some embodiments, the display substrate further includes a plurality of light sources LS and a color filter CF on a side of the first encapsulating layer EN1 away from the first base substrate BS1. Optionally, the color filter CF includes a plurality of color filter blocks, for example, a respective color filter block of a first color of the plurality of color filter blocks of the first color CFBs1, a respective color filter block of a second color of the plurality of color filter blocks of the second color CFBs2, and optionally a respective color filter block of a third color of the plurality of color filter blocks of the third color CFBs3. At least two adjacent color filter blocks of the plurality of color filter blocks are spaced apart by one or more light sources of the plurality of light sources LS. At least two adjacent light sources of the plurality of light sources LS are spaced apart by at least one color filter block of the plurality of color filter blocks. Optionally, one or more light sources of the plurality of light sources are in a first gap G1 between two adjacent color filter blocks of the plurality of color filter blocks. Optionally, an individual color filter block of the plurality of color filter blocks is in a second gap G2 between two light sources of the plurality of light sources. Optionally, any pair of two light sources are spaced apart by a color filter block.

In some embodiments, an orthographic projection of the plurality of light sources LS and an orthographic projection of the color conversion layer CCL on a plane perpendicular to a surface of the first base substrate BS1 and intersecting the plurality of light sources LS and the color conversion layer CCL (for example, the plane along which the cross-section of FIG. 2A is made) are non-overlapping. Optionally, the orthographic projection of the plurality of light sources LS and the orthographic projection of the color conversion layer CCL on any plane perpendicular to a surface of the first base substrate BS1 and intersecting the plurality of light sources LS and the color conversion layer CCL are non-overlapping.

In some embodiments, the plurality of light sources LS are not in direct contact with the color conversion layer CCL. For example, the plurality of color conversion blocks, including the first color conversion block CCB1 and the second color conversion block CCB2, are not in direct contact with the plurality of light sources LS. Optionally, the plurality of light sources LS are spaced apart from the color conversion layer CCL by at least the first encapsulating layer EN1.

In some embodiments, the color filter CF is not in direct contact with the color conversion layer CCL. For example, the plurality of color filter blocks, including the respective color filter block of a first color of the plurality of color filter blocks of the first color CFBs1, the respective color filter block of a second color of the plurality of color filter blocks of the second color CFBs2, and the respective color filter block of a third color of the plurality of color filter blocks of the third color CFBs3, are not in direct contact with the color conversion layer CCL. Optionally, the color filter CF is spaced apart from the color conversion layer CCL by at least the first encapsulating layer EN1.

In some embodiments, the definition layer DL includes a plurality of ridges RG arranged in rows and columns. In a cross-section of a respective ridge of the plurality of ridges RG along a plane intersecting the plurality of color conversion blocks (e.g., the cross-section as shown in FIG. 2A), a width of the respective ridge gradually decreases along a direction away from the first base substrate BS1. Optionally, an included angle α between a respective lateral surface of a respective ridge and a surface of the first base substrate BS1 is between 0 degree and 90 degrees, for example, between 0 degree and 10 degrees, between 10 degree and 20 degrees, between 20 degree and 30 degrees, between 30 degree and 40 degrees, between 40 degree and 50 degrees, between 50 degree and 60 degrees, between 60 degree and 70 degrees, between 70 degree and 80 degrees, or between 80 degree and 90 degrees.

In some embodiments, a portion of the reflective layer RL is on lateral side surfaces of the plurality of ridges RG. Optionally, the portion of the reflective layer RL covers the lateral side surfaces of the plurality of ridges RG. Optionally, an included angle α between the portion of the reflective layer RL on the lateral side surfaces of the plurality of ridges RG and a surface of the first base substrate BS1 is between 0 degree and 90 degrees, for example, between 0 degree and 10 degrees, between 10 degree and 20 degrees, between 20 degree and 30 degrees, between 30 degree and 40 degrees, between 40 degree and 50 degrees, between 50 degree and 60 degrees, between 60 degree and 70 degrees, between 70 degree and 80 degrees, or between 80 degree and 90 degrees.

In some embodiments, the display substrate includes a plurality of subpixel regions SR and an inter-subpixel region ISR. The plurality of color filter blocks are in the plurality of subpixel regions SR, respectively. The plurality of light sources LS are in the inter-subpixel region ISR. In one example, the inter-subpixel region ISR is a unitary region.

In one example, the first color is a red color, the second color is a green color, and the third color is a blue color. The plurality of light sources LS are configured to emit a blue light. In one example, the first color conversion block CCB1 is configured to convert a blue light from a first light source into a red light; the second color conversion block CCB2 is configured to convert the blue light from a second light source into a green light; and the light scattering block SB is configured to scatter the blue light from a third light source. The reflective layer RL is configured to reflect the red light converted by the first color conversion block CCB1 into the respective color filter block of the first color of the plurality of color filter blocks of the first color CFBs1, reflect the green light converted by the second color conversion block CCB2 into the respective color filter block of the second color of the plurality of color filter blocks of the second color CFBs2, and reflect the blue light scattered by the light scattering block SB into the respective color filter block of the third color of the plurality of color filter blocks of the third color CFBs3. In another example, the respective color filter block of the first color of the plurality of color filter blocks of the first color CFBs1 is a red color filter block, the respective color filter block of the second color of the plurality of color filter blocks of the second color CFBs2 is a green color filter block, and the respective color filter block of the third color of the plurality of color filter blocks of the third color CFBs3 is a blue color filter block.

Figure 4:
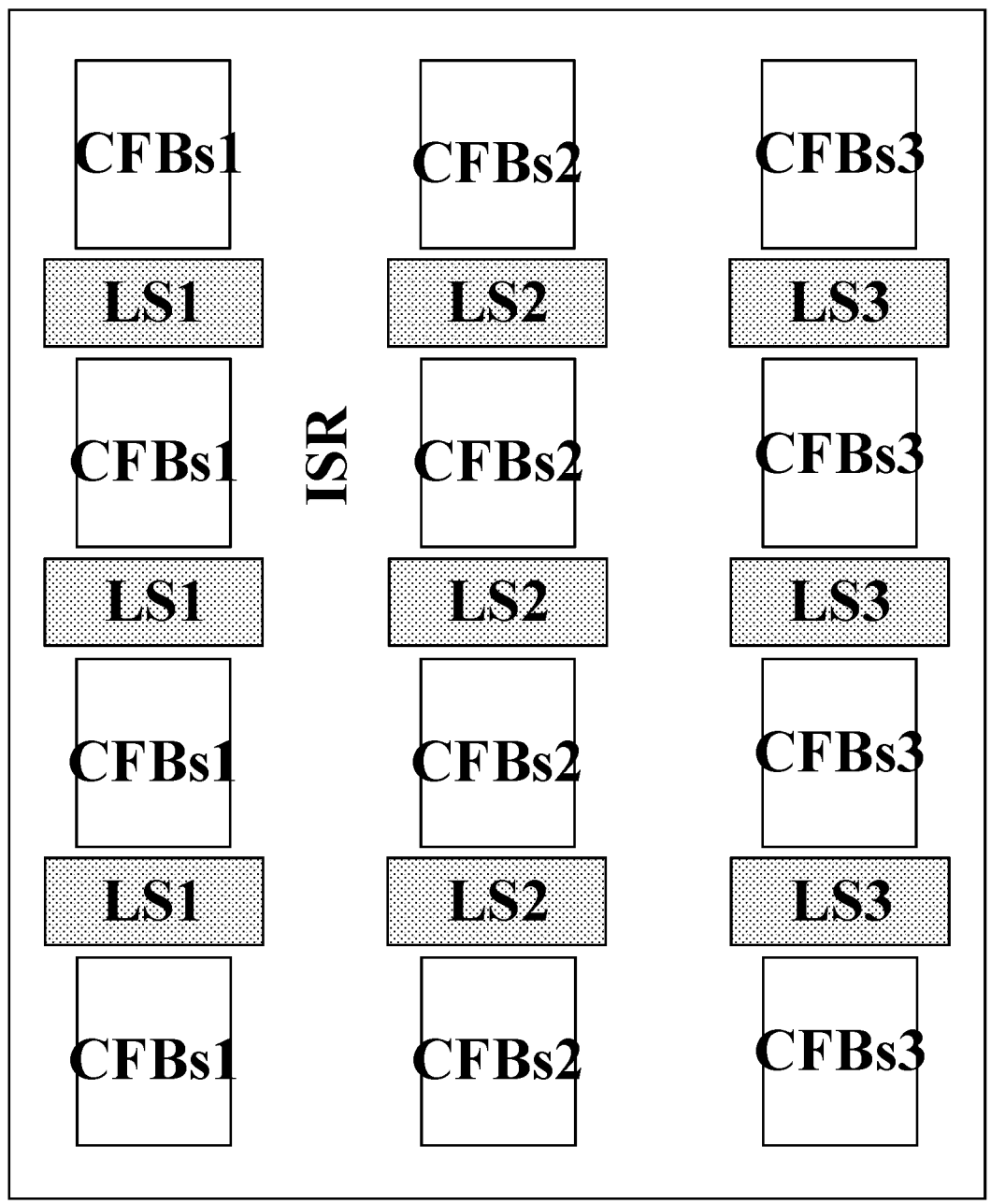
FIG. 4 is a plan view of a plurality of light sources and a color filter in a display substrate in some embodiments according to the present disclosure.

FIG. 4 is a plan view of a plurality of light sources and a color filter in a display substrate in some embodiments according to the present disclosure. Referring to FIG. 4, the plurality of color filter blocks are in the plurality of subpixel regions, respectively; while the plurality of light sources are in the inter-subpixel region ISR. As shown in FIG. 4, the plurality of color filter blocks include a plurality of color filter blocks of the first color CFBs1, a plurality of color filter blocks of the second color CFBs2, and a plurality of color filter blocks of the third color CFBs3. The plurality of light sources includes a plurality of first light sources LS1 configured to provide light for the plurality of color filter blocks of the first color CFBs1, and a plurality of second light sources LS2 configured to provide light for the plurality of color filter blocks of the second color CFBs2, and a plurality of third light sources LS3 configured to provide light for the plurality of color filter blocks of the third color CFBs3. As shown in FIG. 4, a respective light source is between two adjacent color filter blocks of a same color. For example, a respective first light source of the plurality of first light sources LS1 is between two adjacent color filter blocks of the first color of the plurality of color filter blocks of the first color CFBs1, a respective second light source of the plurality of second light sources LS2 is between two adjacent color filter blocks of the second color of the plurality of color filter blocks of the second color CFBs2, and a respective third light source of the plurality of third light sources LS3 is between two adjacent color filter blocks of the third color of the plurality of color filter blocks of the third color CFBs3.

In some embodiments, multiple color filter blocks of a same color are arranged in a same column. For example, a respective column of color filter blocks includes exclusively color filter blocks of the same color. FIG. 4 shows three columns of color filter blocks. A first column of color filter blocks includes color filter blocks of the first color. A second column of color filter blocks includes color filter blocks of the second color. A third column of color filter blocks includes color filter blocks of the third color. In some embodiments, in a column of color filter blocks of a same color, a respective light source is between two adjacent color filter blocks of the same color.

Figure 5:
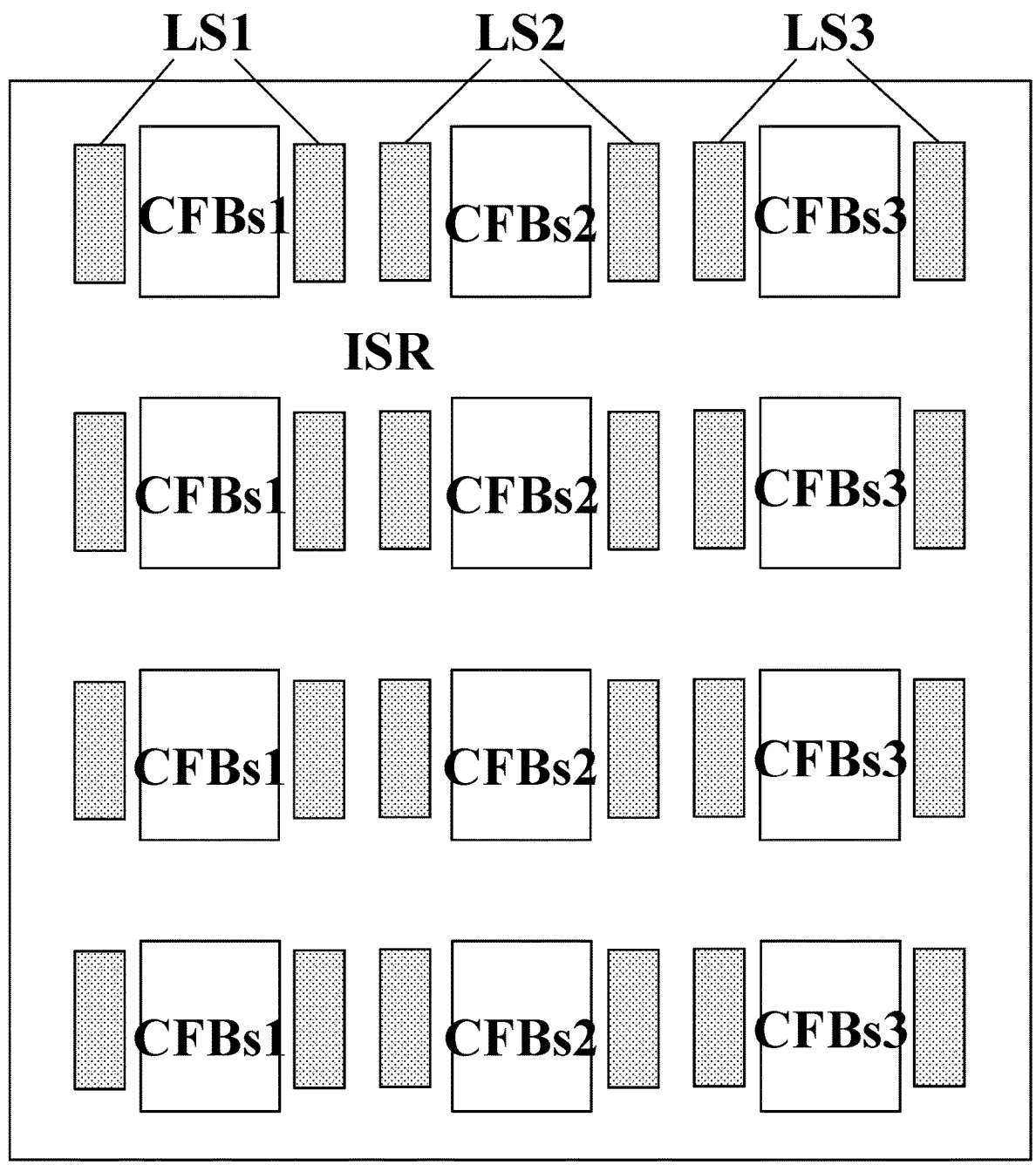
FIG. 5 is a plan view of a plurality of light sources and a color filter in a display substrate in some embodiments according to the present disclosure.

FIG. 5 is a plan view of a plurality of light sources and a color filter in a display substrate in some embodiments according to the present disclosure. Referring to FIG. 5, in some embodiments, a respective light source is between two adjacent color filter blocks of different colors. For example, a respective first light source of the plurality of first light sources LS1 is between a respective color filter block of the first color of the plurality of color filter blocks of the first color CFBs1 and a respective color filter block of the second color of the plurality of color filter blocks of the second color CFBs2. A first respective second light source of the plurality of second light sources LS2 is between a respective color filter block of the first color of the plurality of color filter blocks of the first color CFBs1 and a respective color filter block of the second color of the plurality of color filter blocks of the second color CFBs2. A second respective second light source of the plurality of second light sources LS2 is between a respective color filter block of the second color of the plurality of color filter blocks of the second color CFBs2 and a respective color filter block of the third color of the plurality of color filter blocks of the third color CFBs3. A respective third light source of the plurality of third light sources LS3 is between a respective color filter block of the second color of the plurality of color filter blocks of the second color CFBs2 and a respective color filter block of the third color of the plurality of color filter blocks of the third color CFBs3. Referring to FIG. 5, a respective color filter block is configured to receive light from two adjacent light sources of the plurality of light sources.

In some embodiments, multiple color filter blocks of a same color are arranged in a same column; and multiple color filter blocks of different colors are arranged in a same row. For example, a respective column of color filter blocks includes exclusively color filter blocks of the same color, a respective row of color filter blocks includes color filter blocks of different colors. FIG. 5 shows each row of color filter blocks includes a color filter block of the first color, a color filter block of the second color, and a color filter block of the third color. In some embodiments, in a row of color filter blocks, two independently-controlled light sources are between two adjacent color filter blocks of different colors.

Referring to FIG. 2A, in some embodiments, a respective light source of the plurality of light sources LS includes a second base substrate BS2, a planarization layer PLN on the second base substrate BS2, an anode AD on a side of the planarization layer PLN away from the second base substrate BS2, a light emitting layer EL on a side of the anode AD away from the planarization layer PLN, a cathode CD on a side of the light emitting layer EL away from the anode AD, and a second encapsulating layer EN2 on a side of the cathode CD away from the light emitting layer EL.

Figure 6A:
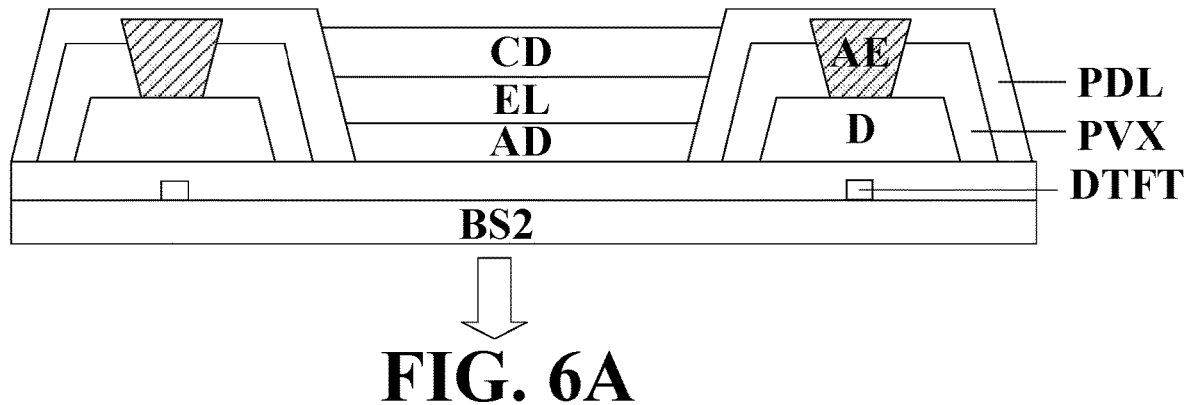
FIG. 6A is a schematic diagram illustrating the structure of a respective light source in some embodiments according to the present disclosure.

FIG. 6A is a schematic diagram illustrating the structure of a respective light source in some embodiments according to the present disclosure. Referring to FIG. 6A, the respective light source includes a second base substrate BS2, and an electrode D (e.g., a drain electrode of a thin film transistor) on the second base substrate BS2 and configured to provide data signal to the respective light source. The respective light source further includes a passivation layer PVX on a side of the electrode D away from the second base substrate BS2; and a pixel definition layer PDL on a side of the passivation layer PVX away from the electrode D. The pixel definition layer PDL defines a respective subpixel aperture configured to receive at least one of an anode AD, a light emitting layer EL, and a cathode CD.

Referring to FIG. 6A, in some embodiments, the cathode CD is made of a reflective material and the cathode CD is a reflective layer. The anode AD is made of a light transmissive material and the anode AD is a light transmissive layer. The respective light source is a bottom-emission type light source.

In some embodiments, the respective light source further includes a driving circuit configured to drive light emission in the light emitting layer EL. Referring to FIG. 2A and FIG. 6A, a driving transistor in the driving circuit is denoted by DTFT. In some embodiments, the driving transistor DTFT (or at least a portion of the driving circuit) is in the inter-subpixel region ISR. Optionally, an orthographic projection of the light emitting layer EL on the second base substrate BS2 is non-overlapping with an orthographic projection of the driving transistor DTFT on the second base substrate BS2.

In some embodiments, the display substrate further includes a third encapsulating layer EN3 on a side of the color conversion layer CCL and the light scattering layer SL away from the first encapsulating layer EN1, encapsulating the plurality of color conversion blocks and the light scattering block SB. Optionally, the third encapsulating layer EN3 is between the reflective layer RL and the plurality of color conversion blocks, and between the reflective layer RL and the light scattering block SB.

Figure 2B:
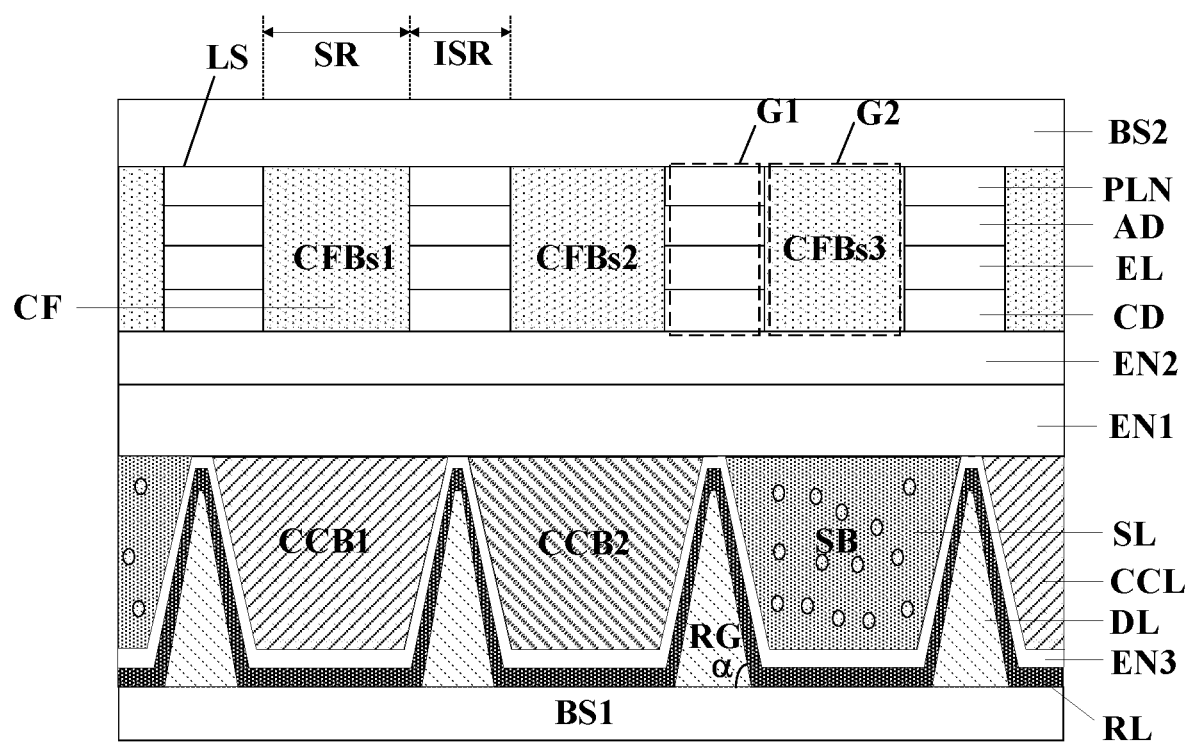
FIG. 2B is a cross-sectional view of a display substrate in some embodiments according to the present disclosure.

In FIG. 2A, the second base substrate BS2 is on a side of the light emitting layer EL closer to the color conversion layer CCL and the light scattering layer SL. In some embodiments, the second base substrate BS2 is on a side of the light emitting layer EL away from the color conversion layer CCL and the light scattering layer SL. FIG. 2B is a cross-sectional view of a display substrate in some embodiments according to the present disclosure. Referring to FIG. 2B, in some embodiments, a respective light source of the plurality of light sources LS includes a second base substrate BS2, a planarization layer PLN on the second base substrate BS2, an anode AD on a side of the planarization layer PLN away from the second base substrate BS2, a light emitting layer EL on a side of the anode AD away from the planarization layer PLN, a cathode CD on a side of the light emitting layer EL away from the anode AD, and a second encapsulating layer EN2 on a side of the cathode CD away from the light emitting layer EL. In FIG. 2B, the second base substrate BS2 is on a side of the light emitting layer EL away from the color conversion layer CCL and the light scattering layer SL; and the second encapsulating layer EN2 is on a side of the light emitting layer EL closer to the color conversion layer CCL and the light scattering layer SL.

Referring to FIG. 6A, the respective light source in some embodiments further includes an auxiliary electrode AE on a side of the electrode D away from the second base substrate BS2. The auxiliary electrode AE is connected to the electrode D. In one example, the electrode D is a drain electrode of a thin film transistor electrically coupled to the anode AD. The auxiliary electrode AE is electrically coupled to the anode AD.

Figure 6B:
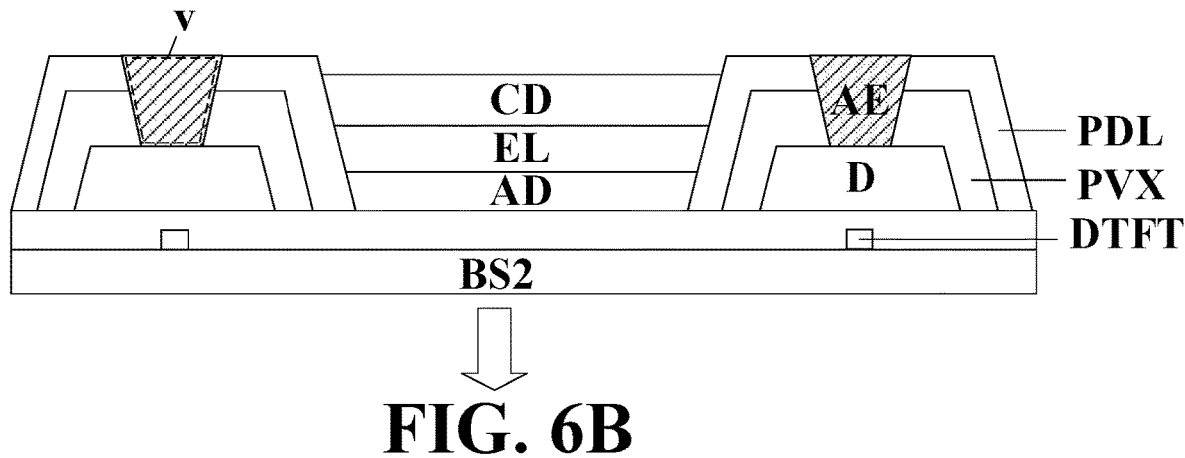
FIG. 6B is a schematic diagram illustrating the structure of a respective light source in some embodiments according to the present disclosure.

FIG. 6B is a schematic diagram illustrating the structure of a respective light source in some embodiments according to the present disclosure. Referring to FIG. 6B, the respective light source in some embodiments further includes a via v extending through the pixel definition layer PDL and the passivation layer PVX. The auxiliary electrode AE extends through the via v to connect to the electrode D. In one example, the auxiliary electrode AE and the cathode CD may be formed in a same patterning process and using a same material.

Figure 6C:
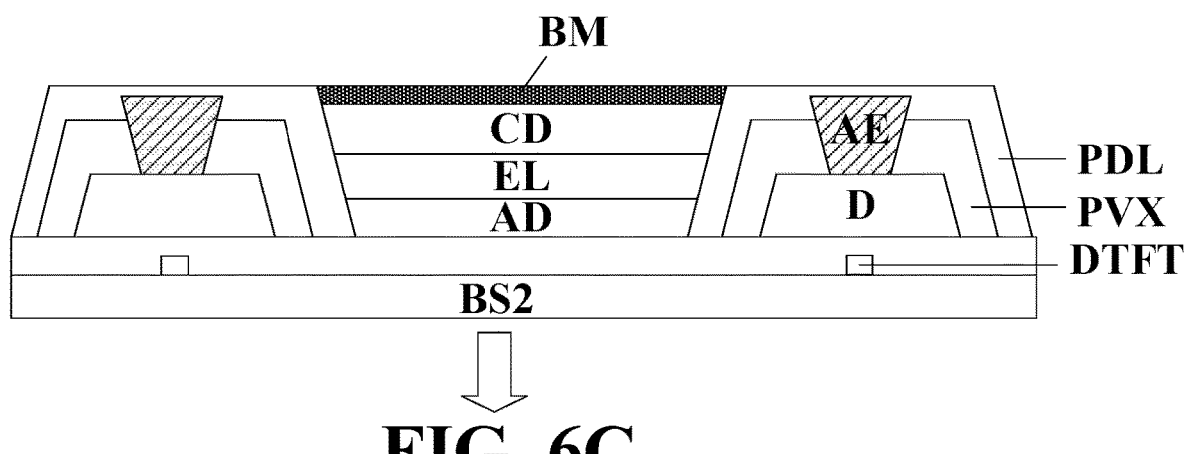
FIG. 6C is a schematic diagram illustrating the structure of a respective light source in some embodiments according to the present disclosure.

FIG. 6C is a schematic diagram illustrating the structure of a respective light source in some embodiments according to the present disclosure. Referring to FIG. 6C, the respective light source in some embodiments further includes a black matrix BM on a side of the cathode CD away from the light emitting layer. The black matrix BM include a black insulating material, and functions as an anti-glare layer to reduce or eliminate the light reflection by the cathode CD. Alternatively, a surface of the cathode CD away from the light emitting layer EL may be treated to be a light diffusing surface, thereby reducing or eliminating the light reflection by the cathode CD.

Figure 7:
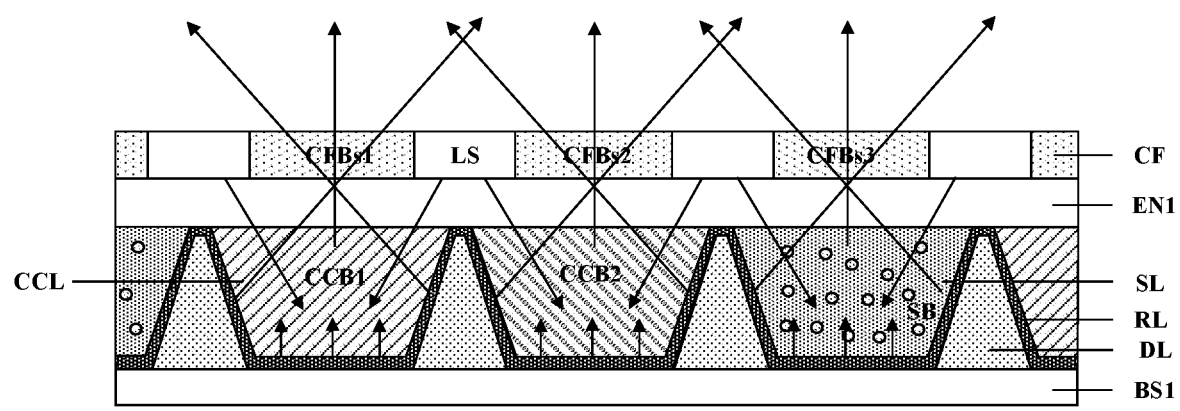
FIG. 7 illustrates a light path in a display substrate in some embodiments according to the present disclosure.

A portion of the reflective layer RL received in a respective aperture defined by the definition layer DL may have various appropriate shapes. FIG. 7 illustrates a light path in a display substrate in some embodiments according to the present disclosure. Referring to FIG. 7, along a plane intersecting two adjacent color conversion blocks of the plurality of color conversion blocks and parallel to a thickness direction of the color conversion layer (e.g., perpendicular to a surface of the first base substrate BS1), a cross-section of the portion of the reflective layer RL received in the respective aperture defined by the definition layer DL has a trapezoidal shape. As shown in FIG. 7, a portion of light converted by a respective color conversion block is reflected by side walls of the trapezoidal-shaped reflective portion. The light reflected by side walls of the trapezoidal-shaped reflective portion is directed toward a respective color filter block at a relatively large view angle, further enhancing light emission luminance level over a wide view angle range.

Figure 8:
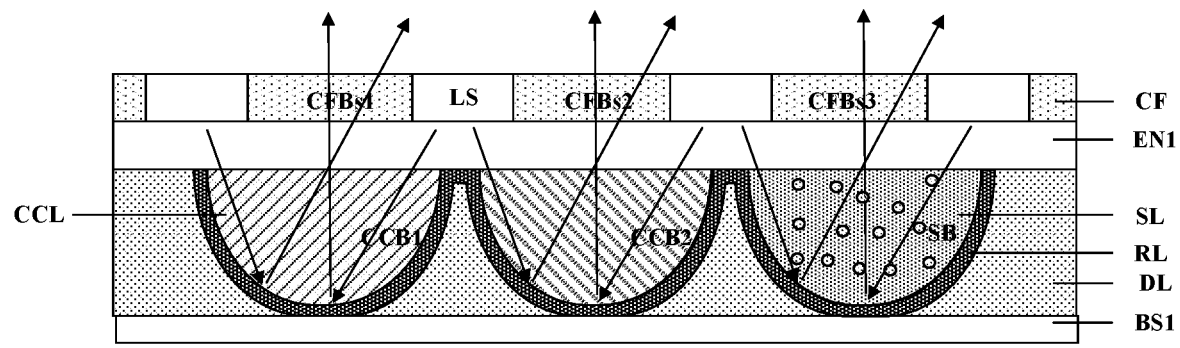
FIG. 8 illustrates a light path in a display substrate in some embodiments according to the present disclosure.

FIG. 8 illustrates a light path in a display substrate in some embodiments according to the present disclosure. Referring to FIG. 8, along a plane intersecting two adjacent color conversion blocks of the plurality of color conversion blocks and parallel to a thickness direction of the color conversion layer (e.g., perpendicular to a surface of the first base substrate BS1), a cross-section of a portion of the reflective layer RL received in the respective aperture defined by the definition layer DL has a partial circular shape such as a half circular shape. As shown in the light path, the portion of the reflective layer RL received in the respective aperture defined by the definition layer DL functions as a concaved mirror to focus a portion of light converted by a respective color conversion block, further enhancing light utilization efficiency of the display substrate, particularly in a range of relatively small viewing angles. Depending on the application of the display substrate, a radius of curvature of the portion of the reflective layer RL received in the respective aperture defined by the definition layer DL may be varied to achieve different degrees of light focus.

Figure 9:
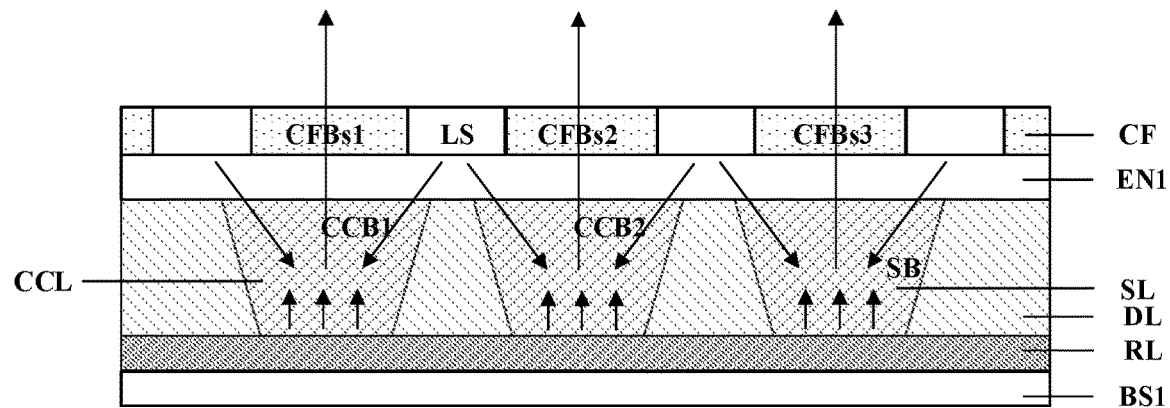
FIG. 9 illustrates a light path in a display substrate in some embodiments according to the present disclosure.

FIG. 9 illustrates a light path in a display substrate in some embodiments according to the present disclosure. Referring to FIG. 9, the reflective layer RL in some embodiments is between the color conversion blocks and the first base substrate BS1, and optionally also between the definition layer DL and the first base substrate BS1. The reflective layer RL is a substantially planar layer, e.g., extending substantially throughout a display area of the display substrate. As shown in FIG. 9, the display substrate in some embodiments includes a first base substrate BS1; a reflective layer RL on the first base substrate BS1; a definition layer DL, a color conversion layer CCL, and a light scattering layer SL on a side of the reflective layer RL away from the first base substrate BS1; and a first encapsulating layer EN1 on a side of the definition layer DL, the color conversion layer CCL, and the light scattering layer SL away from the reflective layer RL. The definition layer DL defines a plurality of apertures configured to receive a plurality of color conversion blocks, respectively. The reflective layer RL is configured to reflect light converted by a respective color conversion block toward a direction away from the first base substrate BS1.

Referring to FIG. 7 to FIG. 9, a respective color filter block of a first color of the plurality of color filter blocks of the first color CFBs1 is optically coupled with a first color conversion block CCB1; a respective color filter block of a second color of the plurality of color filter blocks of the second color CFBs2 is optically coupled with a second color conversion block CCB2; and a respective color filter block of a third color of the plurality of color filter blocks of the third color CFBs3 is optically coupled with a light scattering block SB.

Figure 10:
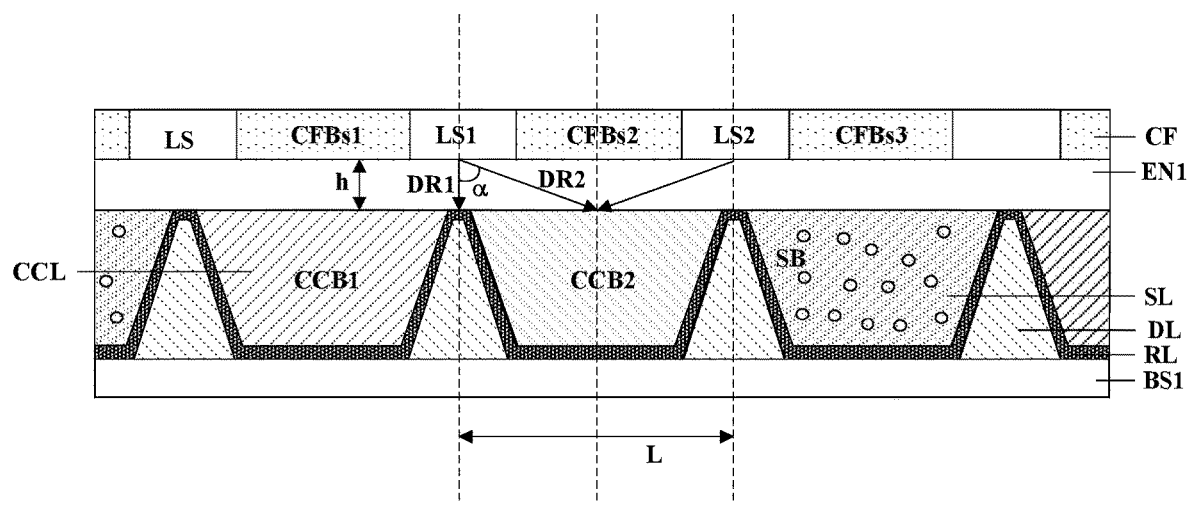
FIG. 10 is a cross-sectional view of a display substrate in some embodiments according to the present disclosure.

FIG. 10 is a cross-sectional view of a display substrate in some embodiments according to the present disclosure. Referring to FIG. 10, a first direction DR1 is a direction along a thickness direction of the first encapsulating layer EN1 (e.g., a direction perpendicular to the first base substrate BS1), a second direction DR2 is a direction from a center of a first respective light source of the plurality of light sources LS to a center of a respective color conversion block of the plurality of color conversion blocks, the first respective light source LS1 of the plurality of light sources LS being adjacent to the respective color conversion block of the plurality of color conversion blocks and configured to provide incident light to the respective color conversion block of the plurality of color conversion blocks. An included angle between the first direction DR1 and the second direction DR2 is denoted as α in FIG. 10. The inventors of the present disclosure discover that, to further enhance the light emission luminance level at relatively large view angles, the included angle α is in a range of 60 degrees to 80 degrees, e.g., 60 degrees to 65 degrees, 65 degrees to 70 degrees, 70 degrees to 75 degrees, or 75 degrees to 80 degrees. Optionally, tan α=L/2 h; wherein h stands for a thickness of the first encapsulating layer EN1; L stands for a distance between centers of two adjacent light sources (e.g., the first respective light source LS1 and the second respective light source LS2) configured to provide incident light to the respective color conversion block of the plurality of color conversion blocks. Optionally, the included angle α is 70 degrees.

Figure 11:
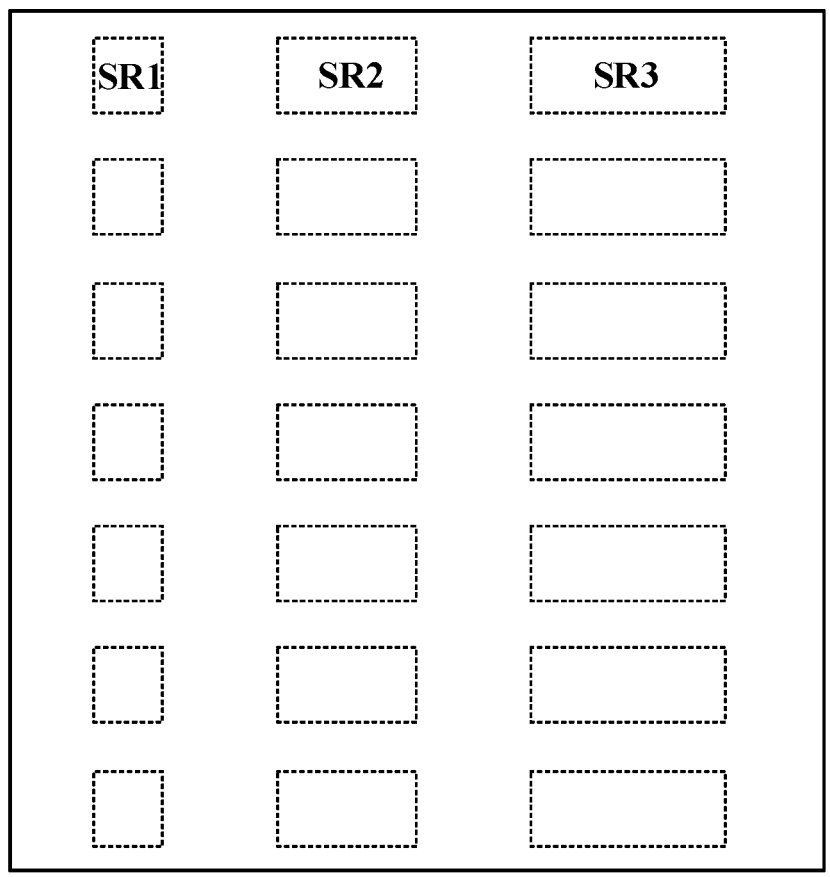
FIG. 11 illustrates an arrangement of subpixel regions in a display substrate in some embodiments according to the present disclosure.

The inventors of the present disclosure discover that, to further enhance light utilization efficiency and reduce power consumption, subpixel regions respectively of different colors may be made to have different areas. FIG. 11 illustrates an arrangement of subpixel regions in a display substrate in some embodiments according to the present disclosure. Referring to FIG. 11, the display substrate includes a plurality of first subpixel regions SR1, a plurality of second subpixel regions SR2, and a plurality of third subpixel regions SR3. A respective third subpixel region of the plurality of third subpixel regions SR3 has a third area greater than a second area of a respective second subpixel region of the plurality of second subpixel regions SR2. A respective second subpixel region of the plurality of second subpixel regions SR2 has a second area greater than a first area of a respective first subpixel region of the plurality of first subpixel regions SR1.

In some embodiments, a respective first subpixel region corresponds to a respective color filter block of a first color of the plurality of color filter blocks of the first color CFBs1; a respective second subpixel region corresponds to a respective color filter block of a second color of the plurality of color filter blocks of the second color CFBs2; and a respective third subpixel region corresponds to a respective color filter block of a third color of the plurality of color filter blocks of the third color CFBs3.

Figure 12:
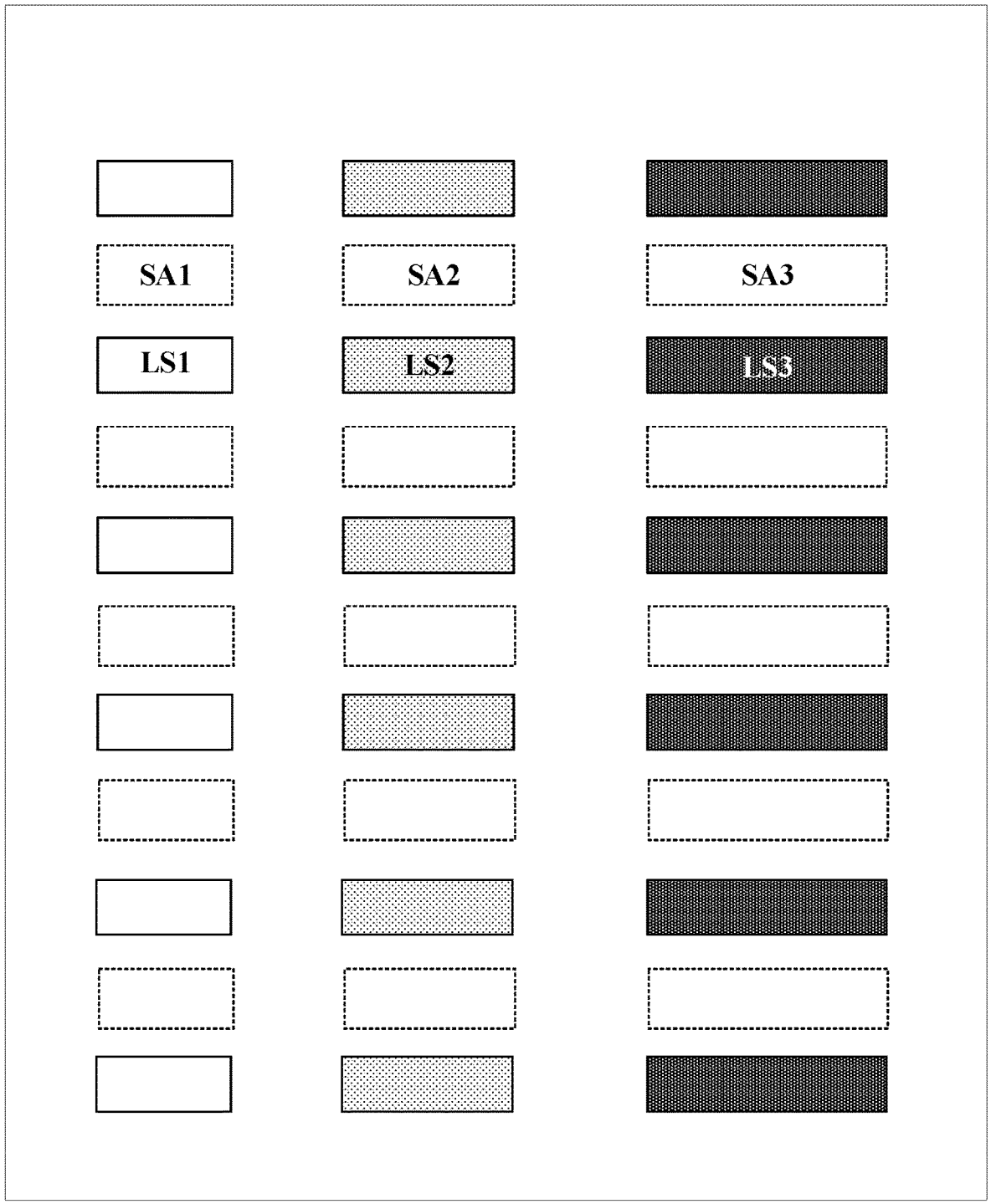
FIG. 12 illustrates an arrangement of light sources relative to subpixel regions in a display substrate in some embodiments according to the present disclosure.

FIG. 12 illustrates an arrangement of light sources relative to subpixel apertures in a display substrate in some embodiments according to the present disclosure. Referring to FIG. 12, the plurality of light sources includes a plurality of first light sources LS1 configured to provide incident light for a plurality of first subpixel apertures SA1 respectively in the plurality of first subpixel regions, and a plurality of second light sources LS2 configured to provide incident light for a plurality of second subpixel apertures SA2 respectively in the plurality of second subpixel regions, and a plurality of third light sources LS3 configured to provide incident light for a plurality of third subpixel apertures SA3 respectively in the plurality of third subpixel regions.

In some embodiments, the plurality of first subpixel apertures SA1 are configured to allow light of the first color to emit out of the display substrate. The plurality of second subpixel apertures SA2 are configured to allow light of the second color to emit out of the display substrate. The plurality of third subpixel apertures SA3 are configured to allow light of the third color to emit out of the display substrate. In some embodiments, the plurality of first subpixel apertures SA1 define the plurality of first subpixel regions, respectively. The plurality of second subpixel apertures SA2 define the plurality of second subpixel regions, respectively. The plurality of third subpixel apertures SA3 define the plurality of third subpixel regions, respectively. In one example, a respective subpixel aperture has a same area as a respective color filter block. In another example, a respective subpixel aperture has an area different from an area of a respective color filter block. In another example, the respective color filter block has an area greater than an area of a respective subpixel aperture, the respective subpixel aperture may be defined by, e.g., a black matrix on the color filter layer.

As shown in FIG. 12, a respective light source is between two adjacent subpixel apertures of a same color. For example, a respective first light source of the plurality of first light sources LS1 is between two adjacent first subpixel apertures of the plurality of first subpixel apertures SA1, a respective second light source of the plurality of second light sources LS2 is between two adjacent second subpixel apertures of the plurality of second subpixel apertures SA2, and a respective third light source of the plurality of third light sources LS3 is between two adjacent third subpixel apertures of the plurality of third subpixel apertures SA3.

Referring to FIG. 12, a respective third light source of the plurality of third light sources LS3 has a sixth area greater than a fifth area of a respective second light source of the plurality of second light sources LS2. A respective second light source of the plurality of second light sources LS2 has a fifth area greater than a fourth area of a respective first light source of the plurality of first light sources LS1.

Figure 13:
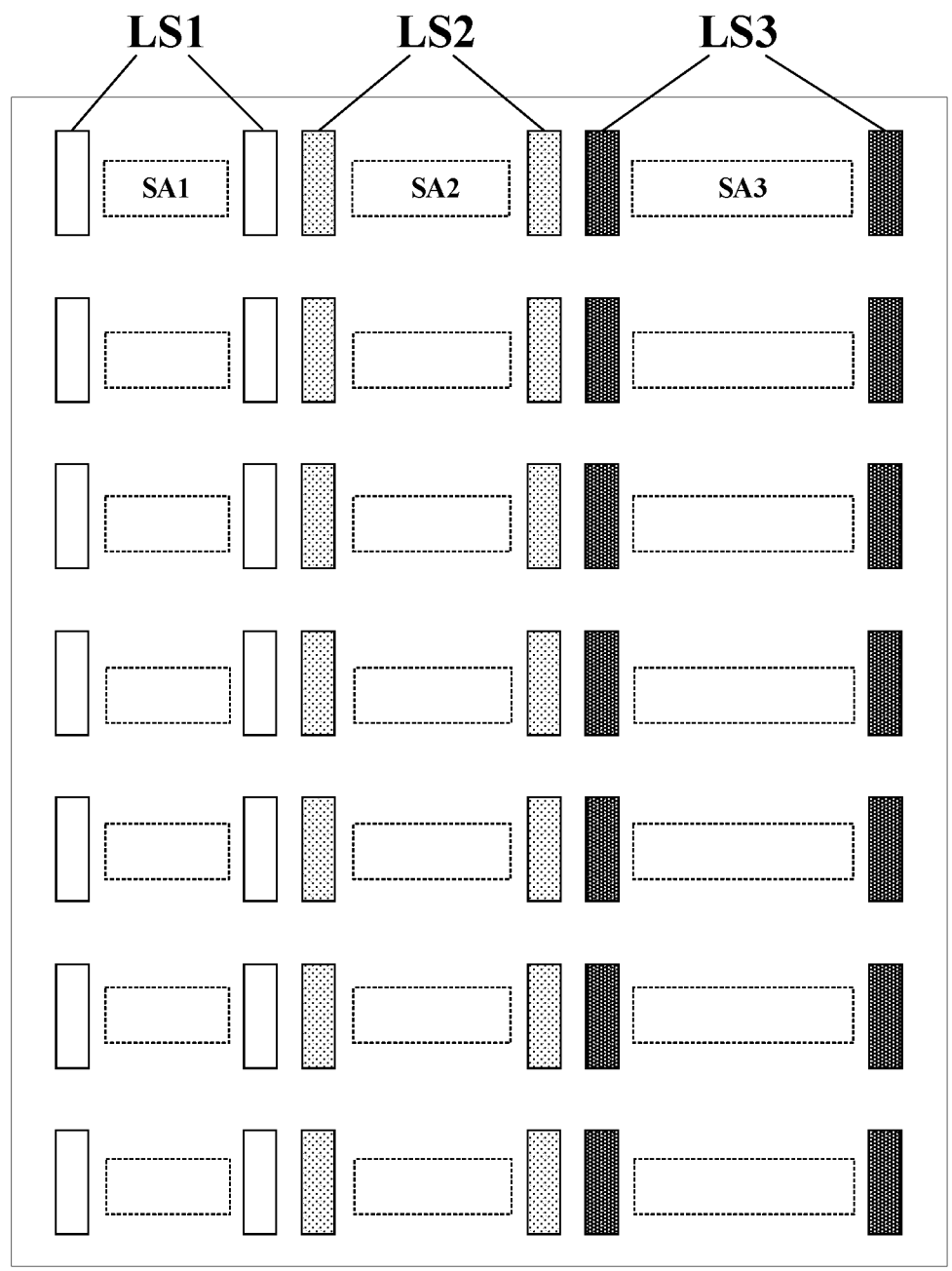
FIG. 13 illustrates an arrangement of light sources relative to subpixel regions in a display substrate in some embodiments according to the present disclosure.

FIG. 13 illustrates an arrangement of light sources relative to subpixel regions in a display substrate in some embodiments according to the present disclosure. Referring to FIG. 13, a respective light source is between two adjacent subpixel regions of different colors. For example, a respective first light source of the plurality of first light sources LS1 is between a respective first subpixel aperture of the plurality of first subpixel apertures SA1 and a respective second subpixel aperture of the plurality of second subpixel apertures SA2. A first respective second light source of the plurality of second light sources LS2 is between a respective first subpixel aperture of the plurality of first subpixel apertures SA1 and a respective second subpixel aperture of the plurality of second subpixel apertures SA2. A second respective second light source of the plurality of second light sources LS2 is between a respective second subpixel aperture of the plurality of second subpixel apertures SA2 and a respective third subpixel aperture of the plurality of third subpixel apertures SA3. A respective third light source of the plurality of third light sources LS3 is between a respective second subpixel aperture of the plurality of second subpixel apertures SA2 and a respective third subpixel aperture of the plurality of third subpixel apertures SA3. Referring to FIG. 13, a respective subpixel region is configured to receive light from two adjacent light sources of the plurality of light sources.

Figure 14:
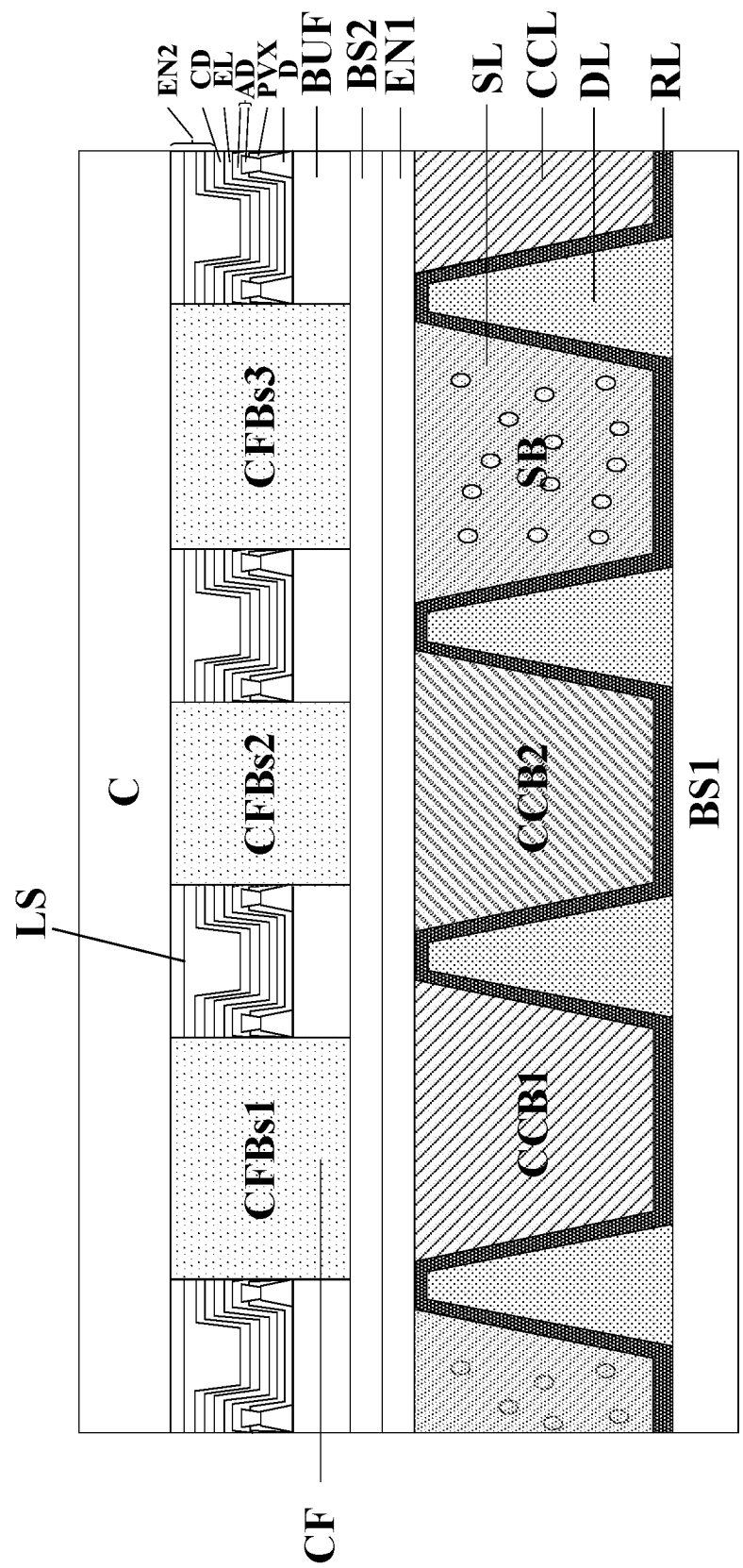
FIG. 14 is a cross-sectional view of a display substrate in some embodiments according to the present disclosure.

FIG. 14 is a cross-sectional view of a display substrate in some embodiments according to the present disclosure. Referring to FIG. 14, the display substrate in some embodiments includes a first base substrate BS1, a definition layer DL on the first base substrate BS1 defining a plurality of apertures; a reflective layer RL on a side of the definition layer DL away from the first base substrate BS1, configured to reflect light toward a direction away from the first base substrate BS1, a color conversion layer CCL on a side of the reflective layer RL away from the base substrate BS, configured to convert the incident light into a light of a different color. Optionally, the color conversion layer CCL includes a plurality of color conversion blocks. For example, the plurality of color conversion blocks include a first color conversion block CCB1 and a second color conversion block CCB2. In one example, the first color conversion block CCB1 is configured to convert a light of a third color (e.g., a blue light) into a light of a first color (e.g., a red light). In another example, the second color conversion block CCB2 is configured to convert the light of the third color (e.g., a blue light) into a light of a second color (e.g., a green light). Subsequent to converting the light of the third color into the light of the first color by the first color conversion block CCB1, and/or converting the light of the third color into the light of the second color by the second color conversion block CCB2, the reflective layer RL is configured to reflect the light of the first color and/or the light of the second color toward a direction away from the first base substrate BS1.

In some embodiments, the display substrate further includes a light scattering layer SL on a side of the reflective layer RL away from the base substrate BS, configured to scatter an incident light. Optionally, the light scattering layer SL does not convert a color of the incident light. Optionally, the light scattering layer SL includes a plurality of light scattering blocks, for example, a light scattering block SB as shown in FIG. 14. Subsequent to scattering the incident light, the reflective layer RL is configured to reflect the incident light toward a direction away from the first base substrate BS1.

In some embodiments, the display substrate further includes a first encapsulating layer EN1 on a side of the color conversion layer CCL and the light scattering layer SL away from the first base substrate BS1, encapsulating the color conversion layer CCL and the light scattering layer SL.

In some embodiments, the display substrate further includes a second base substrate BS2 on a side of the first encapsulating layer EN1 away from the color conversion layer CCL and the light scattering layer SL.

In some embodiments, the display substrate further includes a plurality of light sources LS and a color filter CF on a side of the second base substrate BS2 away from the first encapsulating layer EN1. Optionally, the color filter CF includes a plurality of color filter blocks, for example, a respective color filter block of a first color of the plurality of color filter blocks of the first color CFBs1, a respective color filter block of a second color of the plurality of color filter blocks of the second color CFBs2, and optionally a respective color filter block of a third color of the plurality of color filter blocks of the third color CFBs3.

In some embodiments, the display substrate further includes a cover C on a side of the plurality of light sources LS and the color filter CF away from the second base substrate BS2.

Referring to FIG. 14, in some embodiments, a respective light source of the plurality of light sources LS includes a buffer layer BUF, an electrode D (e.g., a drain electrode of a thin film transistor) on the buffer layer BUF and configured to provide data signal to the respective light source, a passivation layer PVX on a side of the electrode D away from the buffer layer BUF, an anode AD on a side of the passivation layer PVX away from the electrode D, the anode AD extending through the passivation layer PVX to connect to the electrode D, a light emitting layer EL on a side of the anode AD away from the passivation layer PVX, a cathode CD on a side of the light emitting layer EL away from the anode AD, and a second encapsulating layer EN2 on a side of the cathode CD away from the light emitting layer EL, encapsulating the respective light source. Optionally, the anode AD includes multiple sublayers.

In another aspect, the present disclosure provides a display apparatus, including the display substrate described herein or fabricated by a method described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate. In some embodiments, the method includes forming a reflective layer;

forming a color conversion layer on the reflective layer; and forming a plurality of light sources in an inter-subpixel region and a color filter comprising a plurality of color filter blocks at least partially in a plurality of subpixel regions, respectively, on a side of the color conversion layer away from the reflective layer. Optionally, one or more light sources of the plurality of light sources are in a first gap between two adjacent color filter blocks of the plurality of color filter blocks.

Various appropriate insulating materials and various appropriate fabricating methods may be used to make the first base substrate and the second base substrate. For example, an insulating material may be deposited on the substrate by a plasma-enhanced chemical vapor deposition process. Examples of materials suitable for making the first base substrate and the second base substrate include, but are not limited to, glass and polyimide.

Various appropriate reflective material and various appropriate fabricating methods may be used to make the reflective layer. For example, a reflective material may be deposited on the substrate by, e.g., sputtering or vapor deposition, and patterned by, e.g., lithography such as a wet etching process to form a gate electrode layer. Examples of appropriate reflective materials include, but are not limited to, silver and aluminum.

Various appropriate reflective material and various appropriate fabricating methods may be used to make the color conversion layer. For example, the color conversion layer may be made by coating or printing a quantum dots material solution on the substrate. Examples of appropriate quantum dots materials include a quantum dots material of a red color, a quantum dots material of a green color, and a quantum dots material of a blue color. The quantum dots material may include a material selected from a group consisting of CdS, CdSe, ZnSe, InP, PbS, $CsPbCl_3$, $CsPbBr_3$, $CsPhI_3$, CdS/ZnS, CdSe/ZnS, InP/ZnS, PbS/ZnS, $CsPbCl_3$/ZnS, $CsPbBr_3$/ZnS, and $CsPhI_3$/ZnS.

Various appropriate light scattering material and various appropriate fabricating methods may be used to make the light scattering layer. For example, the light scattering layer may be made by coating or printing a light scattering material solution on the substrate. Examples of appropriate light scattering materials include a polymer matrix mixed with particles of magnesium oxide, titanium oxide, or barium sulfate.

Various appropriate transparent electrode materials and various appropriate fabricating methods may be used to make the anode. For example, a transparent electrode material may be deposited on the substrate by a plasma-enhanced chemical vapor deposition (PECVD) process. Examples of appropriate transparent electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

Various appropriate reflective electrode materials and various appropriate fabricating methods may be used to make the cathode. For example, a reflective electrode material may be deposited on the substrate by a plasma-enhanced chemical vapor deposition (PECVD) process. Examples of appropriate reflective electrode materials include, but are not limited to, silver, aluminum, and magnesium.

Various appropriate light emitting materials and various appropriate fabricating methods may be used to make the light emitting layer. For example, a light emitting material may be deposited on the substrate by a plasma-enhanced chemical vapor deposition (PECVD) process. Examples of appropriate light emitting materials include, but are not limited to, diaryl anthracene derivatives, stilbene aromatics, and pyrene derivatives.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A display substrate, comprising:
a first base substrate;
a reflective layer on the first base substrate;
a color conversion layer on a side of the reflective layer away from the first base substrate; and
a plurality of light sources in an inter-subpixel region and a color filter comprising a plurality of color filter blocks at least partially in a plurality of subpixel regions, respectively, on a side of the color conversion layer away from the reflective layer;
wherein one or more light sources of the plurality of light sources are in a first gap between two adjacent color filter blocks of the plurality of color filter blocks; and
an orthographic projection of the plurality of light sources and an orthographic projection of the color conversion layer on a plane perpendicular to a surface of the first base substrate and intersecting the plurality of light sources and the color conversion layer are non-overlapping; and
the plurality of color filter blocks are in the same plane as the one or more light sources.
2. The display substrate of claim 1, wherein an individual color filter block of the plurality of color filter blocks is in a second gap between two light sources of the plurality of light sources; and any pair of two light sources are spaced apart by a color filter block.

3. The display substrate of claim 1, further comprising a light scattering layer on the reflective layer, the light scattering layer comprising a plurality of light scattering blocks; and
an orthographic projection of a respective light scattering block of the plurality of light scattering blocks on the first base substrate at least partially overlaps with an orthographic projection of an individual color filter block of the plurality of color filter blocks on the first base substrate.

4. The display substrate of claim 1, further comprising a definition layer defining a plurality of apertures configured to receive a plurality of color conversion blocks of the color conversion layer.

5. The display substrate of 4, wherein the definition layer comprises a plurality of ridges arranged in rows and columns;
wherein, in a cross-section of a respective ridge of the plurality of ridges along a plane intersecting the plurality of color conversion blocks, a width of the respective ridge gradually decreases along a direction away from the first base substrate;
an included angle between a lateral surface of a respective ridge and a surface of the first base substrate is between 0 degree and 90 degrees; and
a portion of the reflective layer is on lateral side surfaces of the plurality of ridges.

6. The display substrate of claim 4, wherein the definition layer is on a side of the reflective layer away from the color conversion layer; and
the reflective layer comprises a plurality of portions respectively received in the plurality of apertures defined by the definition layer.

7. The display substrate of claim 4, wherein, along a plane intersecting two adjacent color conversion blocks of the plurality of color conversion blocks and parallel to a thickness direction of the color conversion layer, a cross-section of a portion of the reflective layer received in a respective aperture defined by the definition layer has a trapezoidal shape.

8. The display substrate of claim 4, wherein, along a plane intersecting two adjacent color conversion blocks of the plurality of color conversion blocks and parallel to a thickness direction of the color conversion layer, a cross-section of a portion of the reflective layer received in a respective aperture defined by the definition layer has a partial circular shape.

9. The display substrate of claim 4, wherein the definition layer and the color conversion layer are on the reflective layer.

10. The display substrate of claim 9, wherein the reflective layer is a substantially planar layer extending substantially throughout a display area of the display substrate.

11. The display substrate of claim 1, further comprising a first encapsulating layer on a side of the color conversion layer away from the reflective layer, encapsulating the color conversion layer;
wherein the plurality of light sources and the plurality of color filter blocks are on a side of the first encapsulating layer away from the color conversion layer.

12. The display substrate of claim 11, further comprising a third encapsulating layer on a side of the color conversion layer away from the first encapsulating layer, encapsulating the color conversion layer.

13. The display substrate of claim 11, wherein a first respective light source and a second respective light source of the plurality of light sources are configured to provide incident light to a respective color conversion block of the color conversion layer;
an included angle between a first direction and a second direction is in a range of 60 degrees to 80 degrees;
the first direction is a direction along a thickness direction of the first encapsulating layer; and
the second direction is a direction from a center of the first respective light source to a center of the respective color conversion block.

14. The display substrate of claim 1, wherein subpixel regions respectively of different colors have different areas; and
light sources configured to provide incident light to the subpixel regions respectively of different colors have different areas.

15. The display substrate of claim 1, wherein, in a column of color filter blocks of a same color, a respective light source is between two adjacent color filter blocks of the same color.

16. The display substrate of claim 1, wherein, in a row of color filter blocks, two independently-controlled light sources are between two adjacent color filter blocks of different colors.

17. The display substrate of claim 1, wherein a respective light source of the plurality of light sources comprises:
a buffer layer;
an electrode on the buffer layer and configured to provide data signal to the respective light source;
a passivation layer on a side of the electrode away from the buffer layer;
an anode on a side of the passivation layer away from the electrode, the anode extending through the passivation layer to connect to the electrode;
a light emitting layer on a side of the anode away from the passivation layer;
a cathode on a side of the light emitting layer away from the anode; and
a second encapsulating layer on a side of the cathode away from the light emitting layer, encapsulating the respective light source.

18. The display substrate of claim 17, wherein the respective light source further comprises a driving circuit configured to drive light emission in the light emitting layer;
a driving transistor of the driving circuit is in the inter-subpixel region; and
an orthographic projection of the light emitting layer on a second base substrate is non-overlapping with an orthographic projection of the driving transistor on the second base substrate.

19. The display substrate of claim 1, wherein an orthographic projection of the respective color conversion block on the first base substrate at least partially overlaps with an orthographic projection of an individual light source of the plurality of light sources on the first base substrate.

20. A display apparatus, comprising the display substrate of claim 1, and an integrated circuit connected to the display substrate.

* * * * *